(12) United States Patent
Beach et al.

(10) Patent No.: US 7,999,566 B2
(45) Date of Patent: Aug. 16, 2011

(54) WAFER LEVEL TESTING

(75) Inventors: Robert S. Beach, Los Gatos, CA (US);
Arley C. Marley, San Jose, CA (US);
David J. Seagle, Morgan Hill, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 160 days.

(21) Appl. No.: 12/006,406

(22) Filed: Dec. 31, 2007

(65) Prior Publication Data
US 2009/0167333 A1 Jul. 2, 2009

(51) Int. Cl.
*G01R 31/26* (2006.01)

(52) U.S. Cl. ............................. 324/762.01; 324/750.3

(58) Field of Classification Search .................. None
See application file for complete search history.

(56) References Cited

U.S. PATENT DOCUMENTS

| | | | |
|---|---|---|---|
| 5,514,953 A | 5/1996 | Schultz et al. | |
| 5,523,252 A * | 6/1996 | Saito | ............................ 438/18 |
| 6,470,566 B2 | 10/2002 | Hsiao et al. | |
| 6,515,475 B2 | 2/2003 | Goubau et al. | |
| 6,642,713 B2 | 11/2003 | Diederich | |
| 6,779,249 B2 | 8/2004 | Santini | |
| 6,982,042 B2 | 1/2006 | Church et al. | |
| 7,193,815 B1 | 3/2007 | Stoev et al. | |
| 7,240,322 B2 * | 7/2007 | Adkisson et al. | ............... 716/19 |
| 2003/0034489 A1 * | 2/2003 | Bhattacharya et al. | ......... 257/48 |
| 2003/0038626 A1 | 2/2003 | Carrington et al. | |
| 2005/0252576 A1 | 11/2005 | Li et al. | |

FOREIGN PATENT DOCUMENTS

| | | |
|---|---|---|
| JP | 56090413 | 7/1981 |
| JP | 02068704 | 3/1990 |

OTHER PUBLICATIONS

Tang, et al., "A Design Concept of Array Heads", *IEEE Transactions on Magnetics*, vol. 33, No. 3, (May 1997),2397-2401.
Freitas, et al., "Design, Fabrication, and Wafer Level Testing of (NiFe/Cu)xn Dual Stripe GMR Sensors", *IEEE Transactions on Magnetics*, vol. 33, No. 5, (Sep. 1997),2905-2907.
Keithley Instruments, Inc., et al., "Production Testing of GMR Heads with the Model 2400 SourceMeter and the Model 7001 Switch Mainframe", *Keithley Instruments, Inc.*, (2000), 1-6.
Seigler, et al., "Exchange Tab Readback Transducer Using Reactive Ion Etching to Define the Trackwidth", *Journal of Applied Physics*, vol. 91, Issue 10, (May 15, 2002),7288-7290.

* cited by examiner

*Primary Examiner* — Vinh P Nguyen

(57) ABSTRACT

A wafer comprises a kerf region and a test chip. The kerf is a region in a wafer designated to be destroyed by chip dicing. The test chip is located within the kerf region and is configured to provide parametric data for a wafer fabrication process of a head. The test chip comprises a shield portion of a first shield layer electrically coupled to an element, a first pad within a second shield layer electrically coupled to the element, and a second pad within the second shield layer electrically coupled to the shield portion.

12 Claims, 5 Drawing Sheets

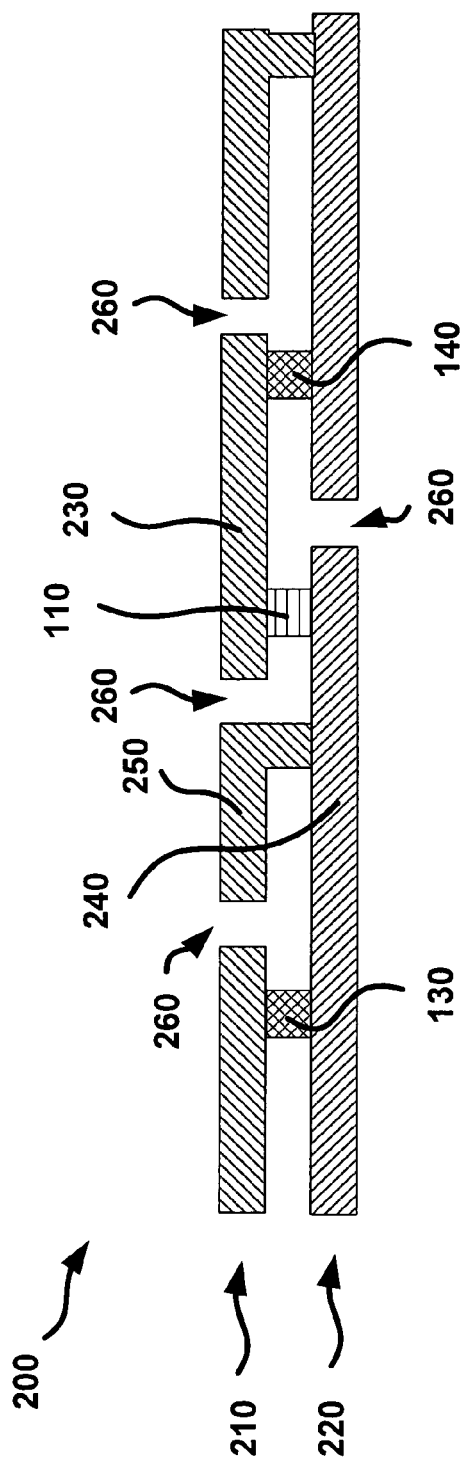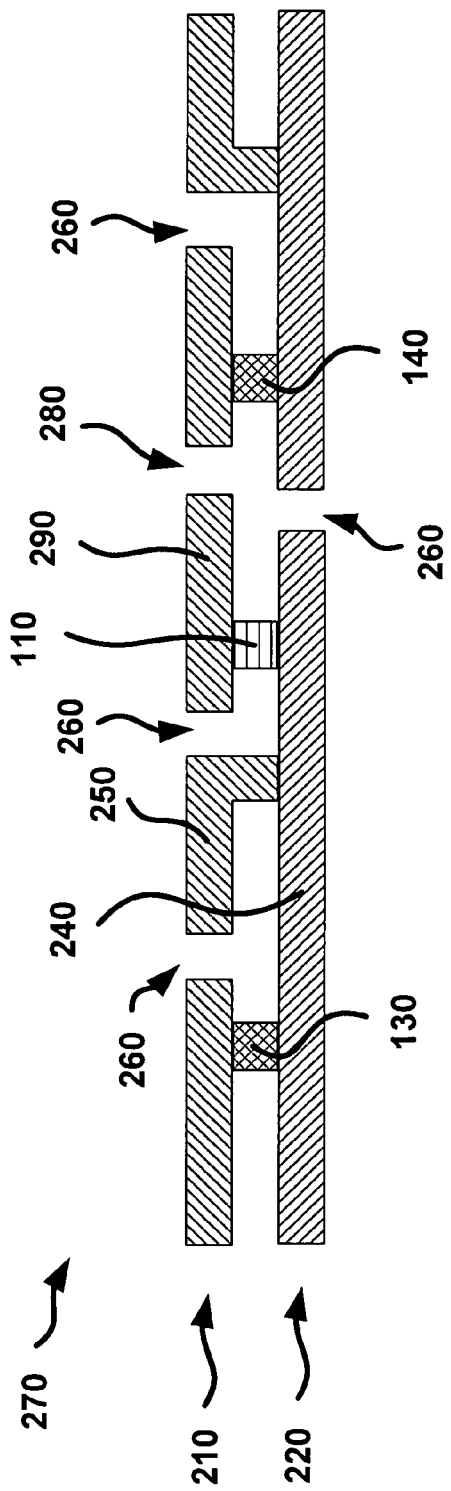

WAFER LEVEL TESTING

TECHNICAL FIELD

Embodiments of the present technology relate generally to the field of wafer processing.

BACKGROUND

Since the development of using wafers to manufacture heads, increasing the yield of heads per wafer had been economically desirable. To obtain higher densities, head sizes have been decreased and wafer space allocated to fabrication, quality control and testing have been minimized. During some fabrication processes, one thirty-sixth of the usable wafer space has been dedicated to fabrication, quality control and testing.

With the continuing decrease in head size, different quality control issues arise, such as an increased significance of material deposition along the head during milling processes. Testing the heads themselves to control the process is problematic due to electrostatic discharge issues and a trend to shunt heads on the wafer. What is needed is a better way to control the wafer process while minimizing the use of wafer space for quality control and testing.

SUMMARY

According to one embodiment of the present invention, a wafer comprises a kerf region and a test chip. The kerf is a region in a wafer designated to be destroyed by chip dicing. The test chip is located within the kerf region and is configured to provide parametric data for a wafer fabrication process of a head. The test chip comprises a shield portion of a first shield layer electrically coupled to the test chip, a first pad within a second shield layer electrically coupled to the test chip, and a second pad within the second shield layer electrically coupled to the shield portion.

BRIEF DESCRIPTION OF THE DRAWINGS

The accompanying drawings, which are incorporated in and form a part of this specification, illustrate embodiments of the presented technology and, together with the description, serve to explain the principles of the presented technology:

FIG. 2A is a side view of FIG. 1 of a four-pad configuration in accordance with an embodiment of the present technology.

FIG. 2B is a side view of FIG. 1 of a five-pad configuration in accordance with an embodiment of the present technology.

Figure 1:
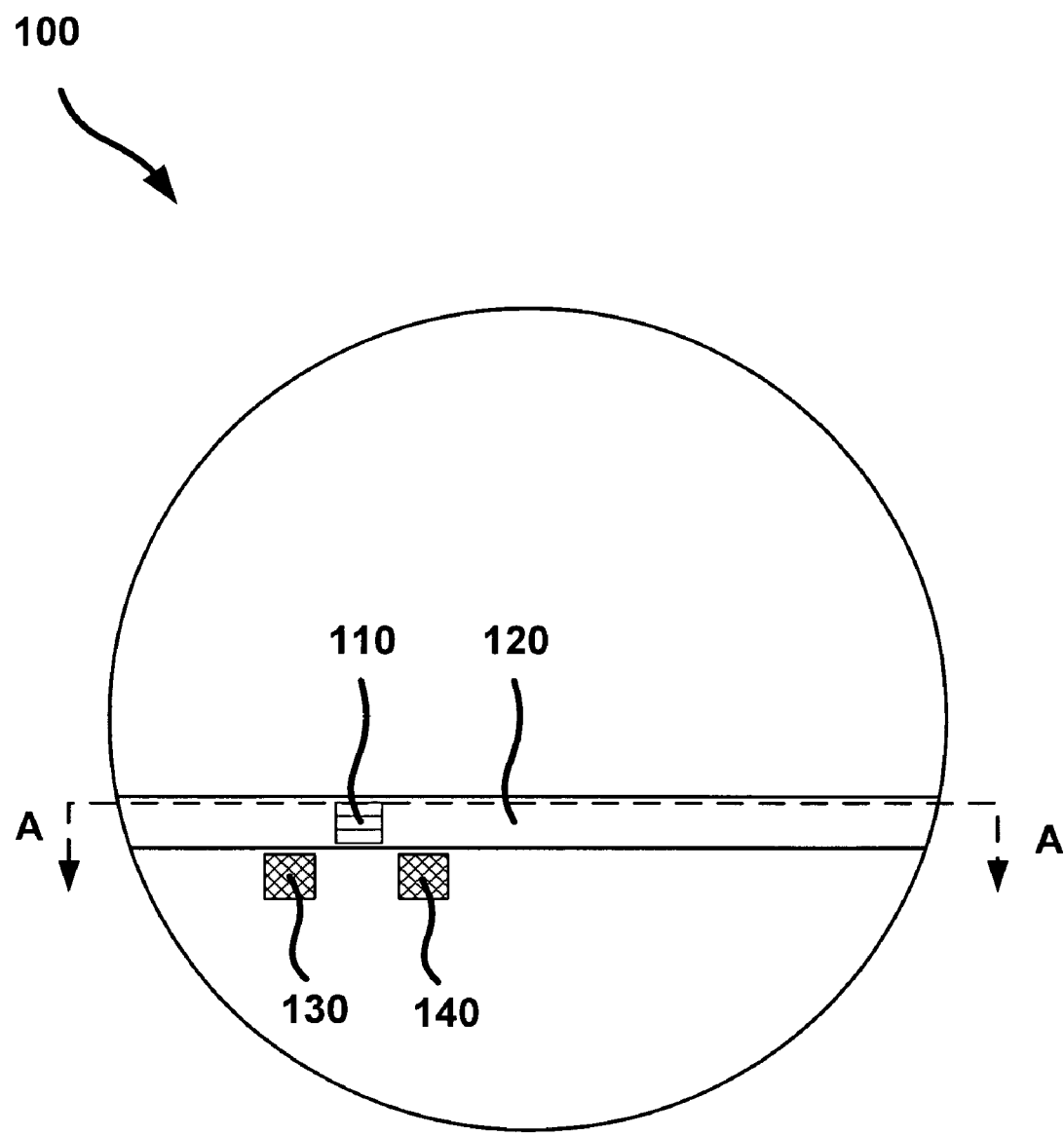
FIG. 1 is a top view of a wafer illustrating a kerf region in accordance with an embodiment of the present technology.

The drawings referred to in this description should not be understood as being drawn to scale unless specifically noted.

DETAILED DESCRIPTION

Reference will now be made in detail to the alternative embodiments of the present technology. While numerous specific embodiments of the present technology will be described in conjunction with the alternative embodiments, it will be understood that they are not intended to limit the present technology to these embodiments. On the contrary, these described embodiments of the present technology are intended to cover alternatives, modifications and equivalents, which may be included within the spirit and scope of the embodiments as defined by the appended claims.

Furthermore, in the following detailed description, numerous specific details are set forth in order to provide a thorough understanding of the present technology. However, it will be recognized by one of ordinary skill in the art that embodiments may be practiced without these specific details. In other instances, well known methods, procedures, components, and circuits have not been described in detail as not to unnecessarily obscure aspects of embodiments of the present technology.

According to one embodiment of the present invention, a wafer comprises a kerf region and a test chip. The kerf is a region in a wafer designated to be destroyed by chip dicing. The test chip located within the kerf region, configured to provide parametric data for a wafer fabrication process of a head. The test chip comprises a shield portion of a first shield layer electrically coupled to an element, a first pad within a second shield layer electrically coupled to the element, and a second pad within the second shield layer electrically coupled to the shield portion.

According to another embodiment of the present invention, a testing method comprises establishing a current through a test chip using probes, measuring a voltage drop across the test chip, and determining a resistance of the test chip. The resistance is determined using the current and the voltage drop. The test chip is located within the kerf region. The probes are positioned near the test chip and within a kerf region.

In yet another embodiment of the present invention, a testing mechanism comprises a kerf region, a plurality of test chips, a means for determining resistances of the plurality of test chips during fabrication, and a means for evaluating statistical distributions, wafer variations and field variations using the determined resistances currents. The plurality of test chips is located within the kerf region.

In various embodiments, tunneling magnetoresistance and current-perpendicular-to-plane giant magnetoresistance wafer level testing is performed using quasi-static and/or high-frequency testing procedures. Wafer level testing may be more effectively performed using a large number of different types of test chips in combination with a statistically large number of each type of test chip. The statistically large number of each type of test chip may be used to maintain uniform stripe heights and uniform track widths over the entire wafer.

The large number of different types of test chips may be used to test different parameters for several different desired measurements, such as, shunting from the stripe define process, shunting from the track width define process, corner shunting, resistance times area, magnetoresistance ratio, active track width, a control on wafer stripe height only process, and a control on magnetic read width only process.

To accommodate the large number of test chips, the kerf region, an area designated to be destroyed by chip dicing, is used to place the test chips without reducing wafer space used for head fabrication. During the process of the head fabrication, two shield layers are deposited in kerf region. The test chips are configured to use these shield layers, thereby reducing additional procedural steps that would otherwise be necessary for testing.

FIG. 1 is a top view of a wafer 100 illustrating a kerf region in accordance with an embodiment of the present technology. The wafer 100 comprises an element 110, a kerf region 120, a head 130, and a head 140. The element 110 is positioned within the kerf region 120. In various embodiments two shield layers, discussed further herein, are mainly deposited within the kerf region and are used by the heads.

With reference to FIG. 2A, a side view of FIG. 1 along cross section A-A of a four-pad configuration 200 is shown in accordance with an embodiment of the present technology. The four-pad configuration 200 comprises an element 110, a first shield layer 220, a second shield layer 210, a head 130, and a head 140. The first shield layer 220 and the second shield layer 210 contain gaps 260. The gaps 260 separate the second shield layer 210 into four regions that may be used for pads, such as, a pad 230 and a pad 250. The element 110 is electrically coupled to pad 230 and pad 250. A test chip comprises the pad 230, the pad 250, and the element 110.

The test chip may be configured in various dimensions, shapes, and/or materials depending on a test type. For example, a stripe height of the element 110 may be shorter than an actual head stripe height to be used for a first stage in shunt testing. In another example, a multiple stripe heights are used to control the wafer fabrication process. In various embodiments, the element 110 is designed to allow measurements of parameters of a sensor layer structure.

The first shield layer 220 and second shield layer 210 may be deposited using Permalloy or other similar materials. Permalloy is alloy of nickel and iron and may consist of approximately 20% iron. Permalloy has a near zero magnetostriction and may be used as a shield material in magnetic recording.

Pads, such as the pad 230 and the pad 250, are configured to permit contact with probes within the kerf region. Pads are formed during wafer fabrication. In various embodiments pads are electrically isolated from other pads by gaps. Pads provide a surface area for contact with probes. In various embodiments, a four-point probe is used. A four-point probe has two voltage points or probes and two current points or probes. In other embodiments, one point or probe is used for both voltage and current.

A wafer may comprise a plurality of test chips. The test chips may be positioned between two heads to yield as many test chips as there are heads. In some embodiments, the number of test chips is about half the number of heads. In other embodiments, the number of test chips is approximately equal to the number of heads. In still further embodiments, the number of test chips is any number to sufficiently support wafer level testing with a statistically significant number of test chips and a sufficient number of different types of test chips. Some wafer level tests comprise statistical distributions, wafer variations and field variations.

FIG. 2B is a side view of FIG. 1 along cross section A-A of a five-pad configuration 270 in accordance with an embodiment of the present technology. The five-pad configuration is similar to the four-pad configuration 200. A difference between the two configurations is a gap 280. The gap 280 electrically isolates the element 110 from the head 140. In some embodiments, a gap (not depicted) in the first shield layer 220 is positioned between the element 110 and the head 130 to electrically isolate the element 110 from both heads 130-140. An advantage to electrically isolating the element 110 from one of the two adjacent heads is to curtail bleeding from a head, i.e. the head 130 and the head 140, to a substrate (not depicted) during testing.

Figure 3:
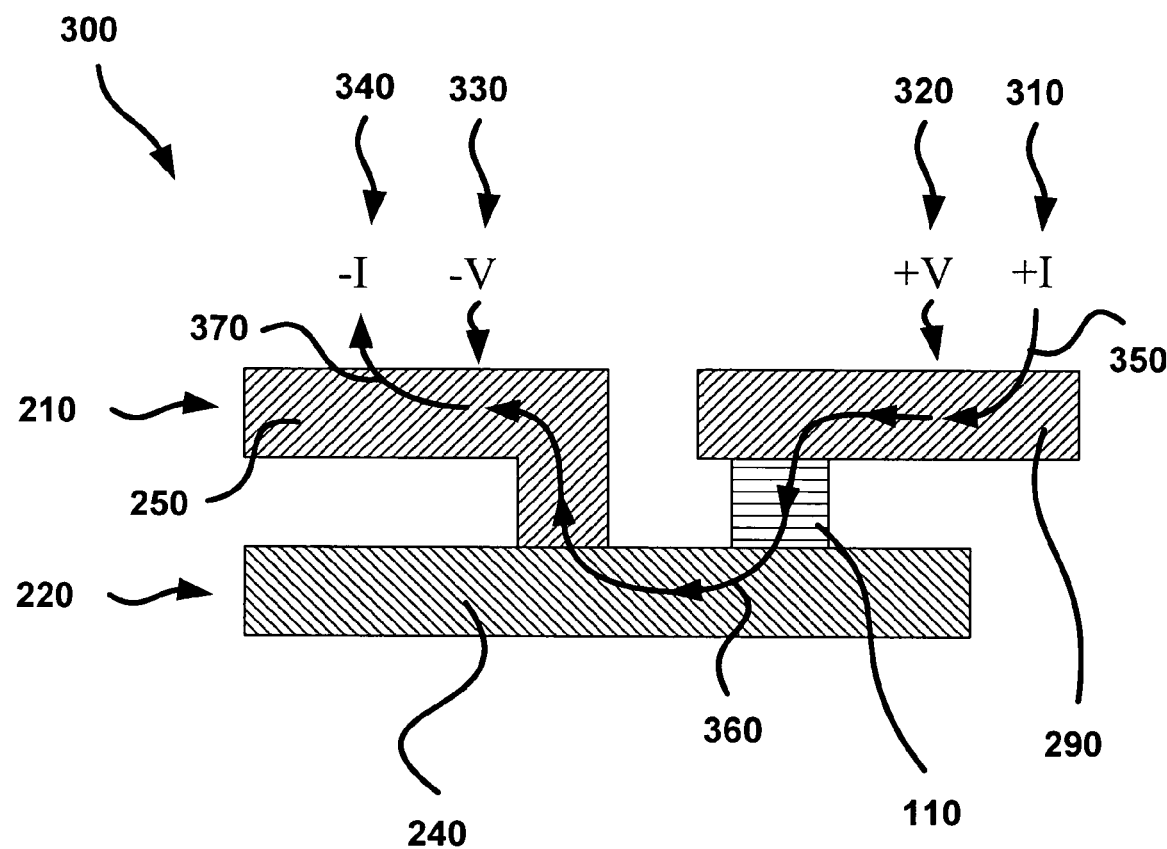
FIG. 3 is a side view of a test chip illustrating current flow for tunneling magnetoresistance test measurements in accordance with an embodiment of the present technology.

In some embodiments, the test chip comprises two pads as discussed herein and in FIG. 3. In other embodiments, the test chip comprises three pads as discussed herein and in FIG. 4.

A pad used by the test chip may be electrically connected to an adjacent head, as shown in FIG. 2A with pad 230, or electrically isolated to an adjacent head, as shown in FIG. 2B with pad 290. An advantage of electrically isolating the test chip from adjacent heads is to isolate the test chip from head to substrate bleeding.

In some embodiments, the test chip is isolated from the head 130 and the head 140. This is accomplished with the addition of a gap (not depicted) in the first shield layer 220 between the element 110 and the head 130. The isolated test chip may be used for capacitance sensitive tests by balancing the capacitance to a substrate, such as high-frequency testing. High-frequency testing may occur at frequencies up to ten gigahertz.

FIG. 3 is a side view of a test chip 300 illustrating current flow for tunneling magnetoresistance test measurements in accordance with an embodiment of the present technology. The test chip 300 comprises an element 110, pads 250 and 290, and a shield portion 240 of the first shield layer 220. The pad 250 and the pad 290 are within the second shield layer 210 and are configured to permit contact with probes, such as probes 310-340.

In various embodiments, a voltage is set across pads 290 and 250 by using probes 310 and 340. The voltage across these probes is adjusted to establish a predetermined direct current that will flow from the probe 310 through the test chip 300 to the probe 340. For this current to flow, the voltage is distributed across the element 110 as well as the contact region of probe-to-pad interfaces for probe/pad combinations of 340/250 and 310/290. A separate voltage sensing device which measures a voltage drop across the test chip 300 is connected to the test chip 300 through probes 320 and 330. As a device under test may be magnetoresistive, a magnetic field, predetermined in magnitude and direction, is placed in a region near and/or including the element 110. This field will establish a particular magnetic state of the element 110. Associated with this state is a particular resistance. Once both the current and field are established, the voltage sensing device measures and records the voltage drop across the test chip 300. This voltage may be mathematically divided by the current to determine the resistance of the element 110 at the specified field and current and/or the resistance of the test chip 300.

In other embodiments, the pad 290 receives a positive voltage via the probe 310 and the pad 250 receives a negative voltage via the probe 340. In other embodiments, the voltages are both positive and have different potentials. In further embodiments, the voltages are both negative and have different potentials.

With the application of the voltages, current flows from pad 290 to pad 250. The current flow is shown in three segments 350-370. The segment 350 is current flow from an area near the probe 310 to an area near the probe 320. The segment 360 is current flow from the area near the probe 320 to an area near the probe 330. The segment 370 is current flow from the area near the probe 330 to an area near the probe 340. The segment 360 is representative of the measured current flow through the element 110.

Figure 4:
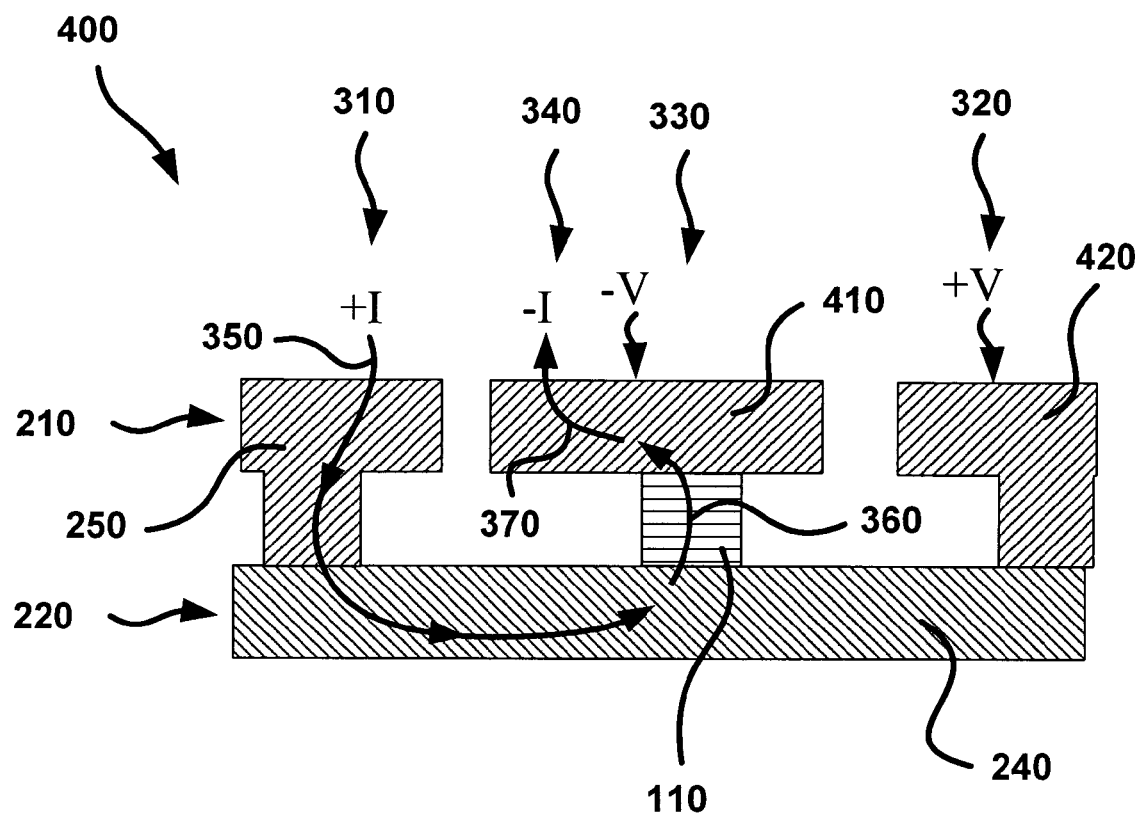
FIG. 4 is a side view of a test chip illustrating current flow for current-perpendicular-to-plane giant magnetoresistance test measurements in accordance with an embodiment of the present technology.

FIG. 4 is a side view of a test chip 400 illustrating current flow for current-perpendicular-to-plane giant magnetoresistance test measurements in accordance with an embodiment of the present technology. The test chip 400 comprises an element 110, pads 250, 410 and 420, and a shield portion 240 of the first shield layer 220. The pads 250, 410 and 420 are within the second shield layer 210 and are configured to permit contact with probes, such as probes 310-340.

The test chip 400 is similar to the test chip 300 in that they both are configured to be able to determine a resistance of the element 110. A difference between the test chips is that test chip 400 has an additional pad. This allows for a more accurate measurement of a voltage drop across the element 110 as the segment 360 in FIG. 4 is mainly across the element 110. This approach may yield better test results for devices with lower magnetoresistance and/or lower total resistance.

Figure 5:
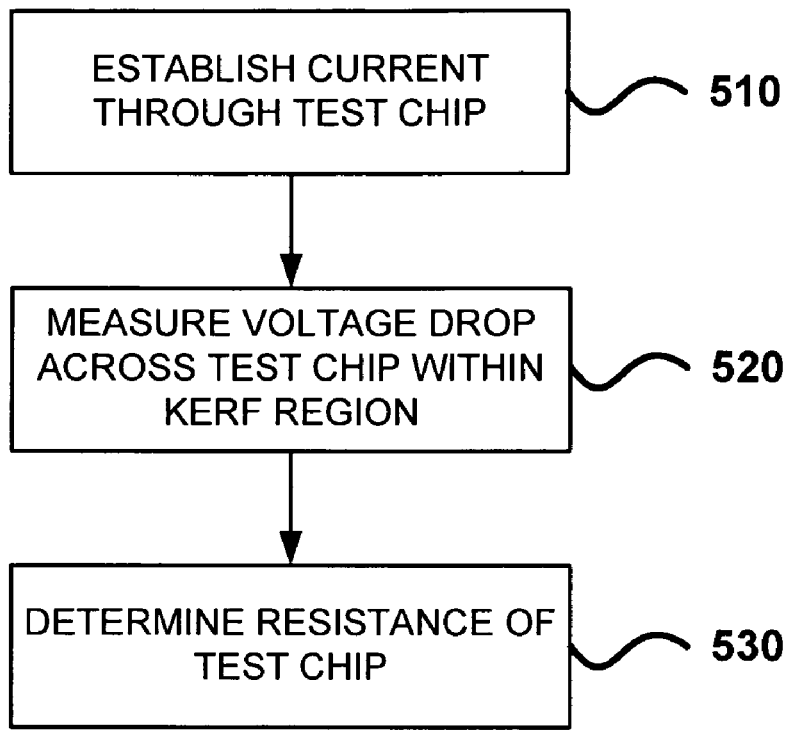
FIG. 5 is a flow diagram of an example method for measuring a resistance of a test chip in accordance with an embodiment of the present technology.

FIG. 5 is a flow diagram of an example method for measuring a resistance of a test chip, in accordance with an embodiment of the present technology. In step 510, a current is established through a test chip using probes. The probes are positioned near the test chip and within a kerf region.

In step 520, a voltage drop is measured across the test chip. The voltage drop is measured using a second set of probes. In some embodiments, the probes are positioned on similar pads as the probes establishing the current. In other embodiments, the probes are positioned using one similar pad as the probes establishing the current.

In step 530, a resistance of the test chip is determined. The resistance is determined using the current and the measured voltage drop.

In various embodiments, resistances of the test chips are determined using currents and voltage drops. Evaluations may be made for statistical distributions, wafer variations and field variations using the resistances. In other embodiments, a uniform wafer and/or wafer region design is maintained based on the evaluation of the statistical distributions.

To obtain wafer control, a number of measurements are taken across test chips. Test chips measurements may be taken at various stages in the wafer fabrication process. Some test chips are measured several times and used for several different testing parameters. Other test chips are measured once for one specific test.

The foregoing descriptions of example embodiments have been presented for purposes of illustration and description. They are not intended to be exhaustive or to limit the teaching to the precise forms disclosed. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A wafer comprising:
   a kerf region in a wafer designated to be destroyed by chip dicing; and
   a test chip located within the kerf region, configured to provide parametric data for a wafer fabrication process of a head, comprising
   a shield portion of a first shield layer electrically coupled to an element;
   a first pad within a second shield layer electrically coupled to the element; and
   a second pad within the second shield layer electrically coupled to the shield portion.

2. The wafer of claim 1, wherein the test chip is between two heads.

3. The wafer of claim 1, wherein the first pad is configured to permit contact with a first probe within the kerf region and the second pad configured to permit contact with a second probe within the kerf region.

4. The wafer of claim 3, wherein the first pad is configured to permit contact with a third probe within the kerf region and the second pad configured to permit contact with a fourth probe within the kerf region.

5. The wafer of claim 3, wherein the first pad is configured to permit contact with a third probe within the kerf region and the test chip further comprises a third pad within the second shield layer electrically coupled to the shield portion configured to permit contact with a fourth probe within the kerf region.

6. The wafer of claim 5, wherein the test chip is configured to test current-perpendicular-to-plane giant magnetoresistance heads.

7. The wafer of claim 1, wherein the test chip further comprises a plurality of pads within the second shield layer and a plurality of shield portions within the first shield layer configured to electrically isolate the test chip, configured for high-frequency testing.

8. The wafer of claim 1, further comprising a plurality of test chips of different types.

9. The wafer of claim 8, wherein the plurality of test chips are configured to evaluate statistical distributions, wafer variations and field variations.

10. The wafer of claim 8, wherein the plurality of test chips are configured to test selected from the group consisting of shunting from the stripe define process, shunting from the track width define process, corner shunting, resistance times area, magnetoresistance ratio, active track width, a control on wafer stripe height only process, a control on magnetic read width only process, and high-frequencies.

11. The wafer of claim 8, wherein the number of test chips is equal to or greater than half the number of heads on the wafer.

12. The wafer of claim 1, wherein the first shield layer and the second shield layer are comprised of Permalloy.

* * * * *